Figure 1:
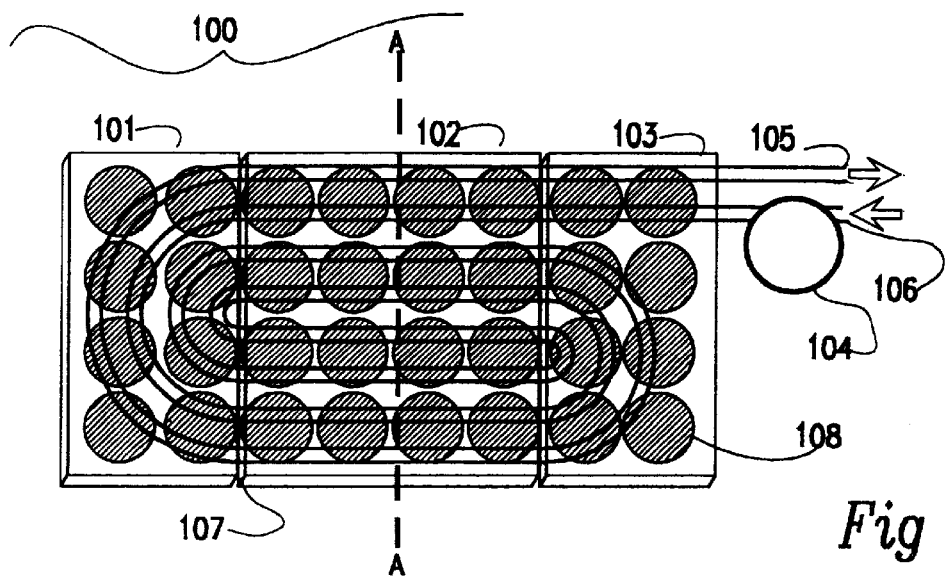

United States Patent [19]
Johnson

[11] Patent Number: 6,080,927
[45] Date of Patent: Jun. 27, 2000

[54] SOLAR CONCENTRATOR FOR HEAT AND ELECTRICITY

[76] Inventor: Colin Francis Johnson, Whangarei Golf Club, Mt Denby, Whangarei 0121, New Zealand

[21] Appl. No.: 08/793,440

[22] PCT Filed: Sep. 14, 1995

[86] PCT No.: PCT/NZ95/00084

§ 371 Date: Feb. 28, 1997

§ 102(e) Date: Feb. 28, 1997

[87] PCT Pub. No.: WO96/08683

PCT Pub. Date: Mar. 21, 1996

[30] Foreign Application Priority Data

Sep. 15, 1994 [NZ] New Zealand ............................ 264460

[51] Int. Cl.[7] ........................ H01L 31/058; H01L 31/052; F24J 2/10; F03G 6/06
[52] U.S. Cl. .......................... 136/248; 136/246; 126/562; 126/573; 126/615; 126/643; 126/646; 126/657; 126/663; 126/684; 126/696; 60/641.11; 60/641.15; 60/531; 310/67 R
[58] Field of Search .................................. 136/246, 248; 126/561, 562, 573, 615, 634, 643, 646, 651, 652, 657, 663, 684, 696; 60/641.8, 641.11, 641.15, 530, 531; 310/67 R

[56] References Cited

U.S. PATENT DOCUMENTS

| | | | |
|---|---|---|---|
| 4,000,734 | 1/1977 | Matlock et al. | 126/576 |
| 4,002,031 | 1/1977 | Bell | 160/641 |
| 4,191,164 | 3/1980 | Kelly | 126/439 |
| 4,249,516 | 2/1981 | Stark | 126/439 |
| 4,823,772 | 4/1989 | Lenz | 126/448 |
| 4,892,593 | 1/1990 | Lew | 136/246 |

FOREIGN PATENT DOCUMENTS

| | | |
|---|---|---|
| 2155111A | 9/1985 | United Kingdom . |
| WO92/15119A | 9/1992 | WIPO . |

OTHER PUBLICATIONS

Schueler et al, "Integration of Photovoltaic and Solar–Thermal Energy Conversion Systems" 11th IEEE Photospecialist Conf. pp. 327–331, May 1975.

Sater et al, "A Cost Effective Total Energy System Using a Faceted Mirror Sunlight Concentrator and High Intensity Solar Cells", Solar Energy Society Congress, pp. 1271–1277, Jan. 1978.

*Primary Examiner*—Bernard Codd
*Attorney, Agent, or Firm*—Bacon & Thomas

[57] ABSTRACT

A solar concentrator for producing usable power as heat and/or electricity uses a self-steering heliostat 1502 to concentrate solar radiation 1509 onto an absorbing surface such as, or including, a solar cell array 1511 capable of absorbing power from the radiation, meanwhile removing heat (such as from long-wave infra-red radiation or resistive losses) from the surface with fluid heat transfer means 1503, 1504, then making effective use of that low-grade heat. Thus the solar cell array is kept relatively cool and a larger proportion of the solar energy incident on the reflector unit is used. The invention uses electricity 1506 from the solar cells to move a transporting fluid through a heat exchanger 1504. Excess electricity may be available for local storage or use 1510, or feeding 1512 to the power distribution grid. Applications include warming swimming pools 1501, heating hot-water supplies using excess electricity, or warming, lighting and ventilating open spaces.

17 Claims, 6 Drawing Sheets

SOLAR CONCENTRATOR FOR HEAT AND ELECTRICITY

TECHNICAL FIELD OF THE INVENTION

This invention relates to improvements in the capture and use of solar energy, wherein energy captured in a heliostat is used as "low-grade" heat and optionally as electricity, produced in a symbiotic relationship.

BACKGROUND

Solar energy has not, as yet, approached its potential for use because of the costs associated with capturing it in a widely useful form. While a type of solar panels can warm water and some architectural constructions capture the sun's heat to warm a space, these capture devices are rather limited in their diversity. Another type of solar panel is adapted to convert light into electricity, but the capital cost of these has prevented their widespread use.

Often a desire to warm an article, a mass of material, or a place is linked to a need to apply other forms of energy to it as well. For example one might want to heat the interior of a building and also supply moving air and lighting, and perhaps electricity in a conventionally usable voltage and frequency. One might want to heat a greenhouse, fan it and light it, or warm a swimming pool and purify the water within it, or dry agricultural produce, laundry, or the like with a combination of heat and moving air. These demands can be met from utilities such as reticulated gas or electricity but they tend to be wasteful of limited supplies in that often only a small increment of heating above ambient is required and there may be alternative sources available for energy which need not be taken from the reticulated supply.

Considering swimming pools as a particular example, there is a need for extension of the duration through a year that a swimming pool can be enjoyed; at present the winter months tend to provide insufficient warming and hence the pool is little used in winter. Domestic swimming pools have the clear primary function of providing leisure activities and also providing a means for exercising. They are also valuable as a reserve of water for fire fighting purposes. Maintenance of the pool for fire fighting depends on its appreciation for its other functions.

Another focus of attention is solar energy. At the time of writing, it is expensive in terms of capital cost to convert sunlight into electricity, largely because of the manufacturing processes involved in making an efficient solar cell out of crystalline (or amorphous) silicon or other scarce semiconductors such as gallium. While some solar cell efficiencies are of the order of 20% these are accompanied by higher capital costs. Much research is being invested in more efficient yet cheap solar cells, or (ideally) a cheap, spray-on or otherwise conformable coating which provides an electric output. Furthermore solar energy is far less effective on a cloudy day, or at night. Yet the benefits of using solar energy are well worth the effort.

Figure 14:
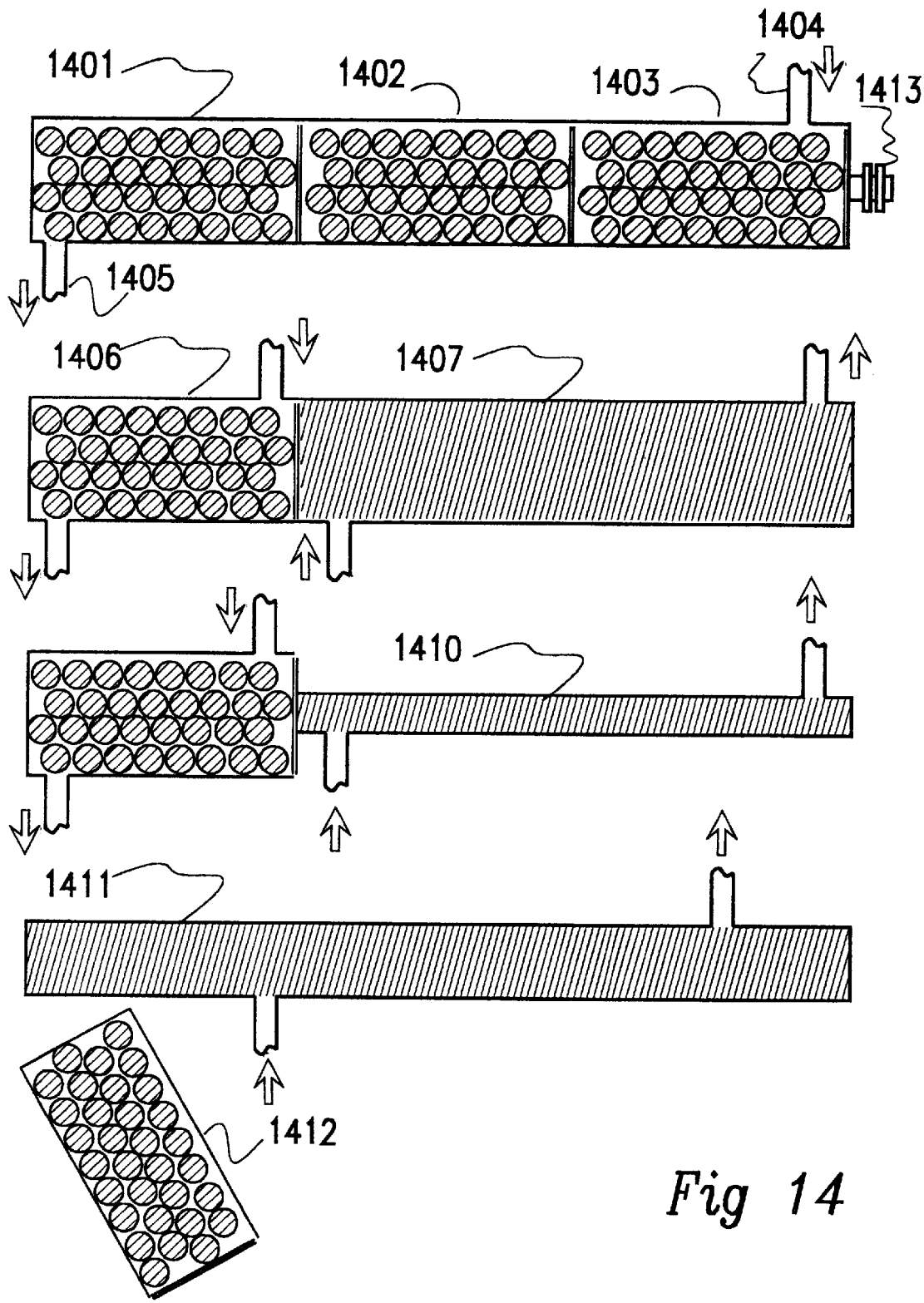

Improving the cost-effectiveness of the capture of power from solar radiation should make non-renewable resources last longer and minimise the destruction of scenic areas for hydro-electric dams or wind farms or the like. An estimate of national power consumption in New Zealand for domestic water heating purposes alone is of the order of 40% of the total electricity generated. Thus a widely applied invention which minimises this particular type of consumption is likely to be useful, also because locally generated power would not incur the additional 10–20% transmission losses that occur when high-voltage current is sent over a considerable distance. New Zealand is nearing the end of its prospects for economical hydro-electric generation (85% of generating capacity is hydro-electric and the average cost of generation is about 3 c per unit). The cost of building a thermal power station is about $4000 per kW of capacity. Windmills are slightly cheaper. There is a growing need for alternative sources, preferably avoiding use of fossil fuels which are non-renewable and add to atmospheric carbon dioxide. FIG. 14 shows examples of various options of absorbing surface as seen from the mirror side.

OBJECT

It is an object of the present invention to provide an improved system for the provision of heat and/or electricity using a solar energy collection device or one which will at least provide the public with a useful choice.

STATEMENT OF THE INVENTION

In one broad aspect the invention comprises a solar concentrator having at least one concentrator unit, each concentrator unit having at least one reflective surface capable of directing and concentrating radiation to an absorbing surface wherein the absorbing surface includes means for converting at least some of the radiation into electricity and the absorbing surface is also provided with fluid transfer means capable of removing heat from the surface.

In a related aspect the invention comprises a solar concentrator, with means capable of removing heat comprises fluid transport means, capable of transporting a fluid within one or more conduits from the surface capable of absorbing power to a heat disposal means, and back again.

In a related aspect the invention comprises a solar concentrator as above, having an absorbing surface comprises a layer of solar cells covered by a one or more transparent or translucent chambers, each capable of carrying said fluid.

In a related aspect the invention comprises a solar concentrator as above, wherein the reflective surface is steerable in order to track the motion of the sun, so that an optimum concentration of radiation is reflected on to the absorbing surface.

In a related aspect the invention comprises a solar concentrator as above, wherein power for use in steering the solar concentrator and for transporting the fluid is derived from the absorbing surface.

In a related aspect the invention comprises a solar concentrator as above, for use in providing heat to a swimming pool, wherein pump means is used to transfer the fluid from the absorbing surface to a heat exchanger associated with the pool and electricity derived from the absorbing surface is used in powering the pump means.

In a related aspect the invention comprises a solar concentrator as above, for use in providing electric power, wherein compressing means is used to transfer the fluid from the absorbing surface to a fluid-driven motor coupled to the compressing means and also coupled to a dynamo-electric machine to produce the electric power.

In a second broad aspect the invention comprises means for producing usable power from solar radiation; the means having at least one concentrator unit, each concentrator unit having at least one reflective surface, capable of directing and concentrating radiation to a surface capable of absorbing power from the radiation, means for removing the power from the surface, the means including conversion means to convert the power into usable power and means for steering the one or more concentrator units towards a source of solar radiation, wherein the surface capable of absorbing the power is also provided with means (fluid heat transfer) capable of removing heat from the surface.

In a related aspect, the invention comprises means capable of removing heat such as fluid transport means, capable of transporting a fluid within one or more conduits from the surface capable of absorbing power to a heat disposal means, and back again.

In a further related aspect, the invention comprises means for transporting the fluid which are capable of being powered by power sampled from the power conversion means.

In a first subsidiary aspect, the invention comprises means to dispose of the heat by causing matter placed within a container to become heated.

In a second subsidiary aspect, the invention also comprises means to use power taken from the power transferring means to further heat the matter within the container.

Preferably the matter comprises water and the container comprises a water heater for storing and providing hot water.

Alternatively the container comprises a swimming pool and the matter comprises water within the swimming pool.

In a further subsidiary aspect, the invention comprises means to purify water in the swimming pool, the means being capable of using further power taken from the power transferring means.

In a further aspect, the invention comprises means capable of creating usable electricity compatible with appliances or with supply to the adjacent distribution mains, using further power taken from the power transferring means.

In a yet further subsidiary aspect, the container receiving heat comprises a heat engine capable of converting the energy within the fluid into kinetic energy.

In an alternative aspect, the invention comprises a method for extracting power from solar radiation, the method involving provision of an energy absorbing surface capable of producing an electric current, used together with means to remove heat from the surface, and means to convert the removed heat into further power.

In a subsidiary aspect, the invention further comprises means to concentrate solar radiation onto the energy absorbing surface, thereby providing an increased output from a given area of energy absorbing surface yet avoiding excessive heating of the energy absorbing surface.

In a third broad aspect the invention provides an array of photovoltaic solar cells capable of being connected to means to make use of the electricity therefrom, said cells being in thermal contact with a heat transfer means absorbing heat arising from within the cells and/or their surroundings and which means is capable of passing the heat to a means adapted to make use of or otherwise dispose of the heat.

Preferably the solar cells are exposed to a concentrated form of illumination such as that reflected from one or more mirrors.

More preferably the concentration of illumination can be by up to 18 times.

Preferably the cells are mounted on a substrate incorporating heat transfer means.

A preferred means adapted to make use of the heat comprises a body of water which is to be warmed, for domestic or recreational purposes or the like.

Preferably the water is taken from the body, warmed directly by being pumped through channels in the substrate, and returned to the body; thereby comprising the heat transfer medium.

Alternatively indirect methods for transferring heat may be used, such as low-boiling point liquids, heat pumps, or air cooling.

An alternative preferred means adapted to make use of the heat comprises a drying kiln which is to have warmed air passed through it.

Preferably the warmed air is created by passing adjacent air through a heat exchanger carrying a heated fluid which is circulated through the substrate on which the solar cells are mounted.

Alternatively the warmed air may be produced by direct heating from fins, without an intermediate fluid heat transfer medium.

Alternatively an intermediate cooling fluid may be used in conjunction with a heat exchanger.

In a fourth broad aspect the invention provides a more efficient solar cell installation in that removal of superfluous heat from the cells causes them to remain cooler and thereby operate more efficiently.

Preferably the solar cells are maintained at temperatures such that the band gap voltages of the semiconductor junctions of the cells are not substantially reduced by high temperatures.

Alternatively water evaporation may be used to reduce the temperature of the cells below the ambient temperature.

Alternatively the electricity generated by the solar cells or a part thereof may be used in conjunction with an active cooling device to maintain the cells at a temperature lower than the ambient temperature.

Preferred active cooling devices include heat pumps (such as closed-cycle refrigeration units) or Peltier-effect coolers.

In a fifth broad aspect the invention provides heating means for a body of water; the heating means comprising an arrangement to direct or focus incident solar radiation onto a light-absorbing surface in thermal contact with a body of water, wherein the light-absorbing surface is principally composed of photovoltaic cells.

Preferably the body of water is a swimming pool.

Preferably the area or aperture of the light-collecting means is about the same area as that of the body of water.

In a related aspect some or all of the surplus electrical energy obtained from the solar cells is used to further heat the body of water.

In a subsidiary aspect the heating means may be resistive as for example a heating element, or may involve heat transfer from the environment as by a heat pump.

In a related aspect water in front of the cell can be used as an infra-red filter or direct heat absorber as well as a coolant.

In a further related aspect the cells may be cooled by a light oil or other nonconducting fluid in direct contact with them, and heat taken up by this fluid may be passed to the pool water within a heat exchanger or the like.

In a sixth aspect some or all of the surplus electrical energy may be used for local purposes such as domestic lighting or water heating, and it may be temporarily stored in batteries for delivery at night.

In a related aspect the surplus electrical energy may be converted into a synchronised mains-level alternating voltage or an approximation thereof by a converter and may be exported optionally for payment from the house into the utility power lines.

In a fifth aspect the light concentrating means comprises a dome-shaped array of light directors; lenses or mirrors.

In a sixth aspect the amount of electricity obtained from a given area of incident radiation may be increased by raising the surface area of the photovoltaic cells as by arranging them over protrusions on a surface.

Preferably the cells of the previous paragraph are produced by a process that enables them to be made in non-planar configurations and preferably they can be applied to non-planar surfaces by spraying, or by evaporation in vacuo.

In a yet further broad aspect the power contained in the solar radiation may first be converted into heat, and then converted into another form of power using a heat engine to convert the heat into kinetic energy, wherein little or no use is made of solar cells.

DRAWINGS

The following is a description of a preferred form of the invention, given by way of example only, with reference to the accompanying diagrams.

FIG. 1: is an illustration of a modular water-cooling device for cooling an array of solar cells with water from (for example) a swimming pool.

FIGS. 2 to 6: show various configurations of sections along line A—A of FIG. 1.

Figure 2:
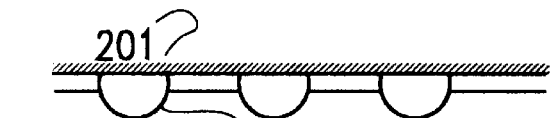
Figure 7:
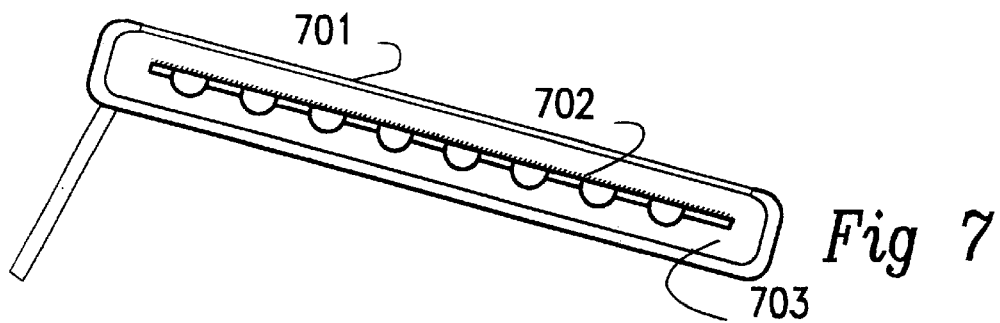

FIG. 7: shows a section of the panel of FIG. 2 placed in a heat-conserving box—along the section A—A of FIG. 1.

Figure 8:
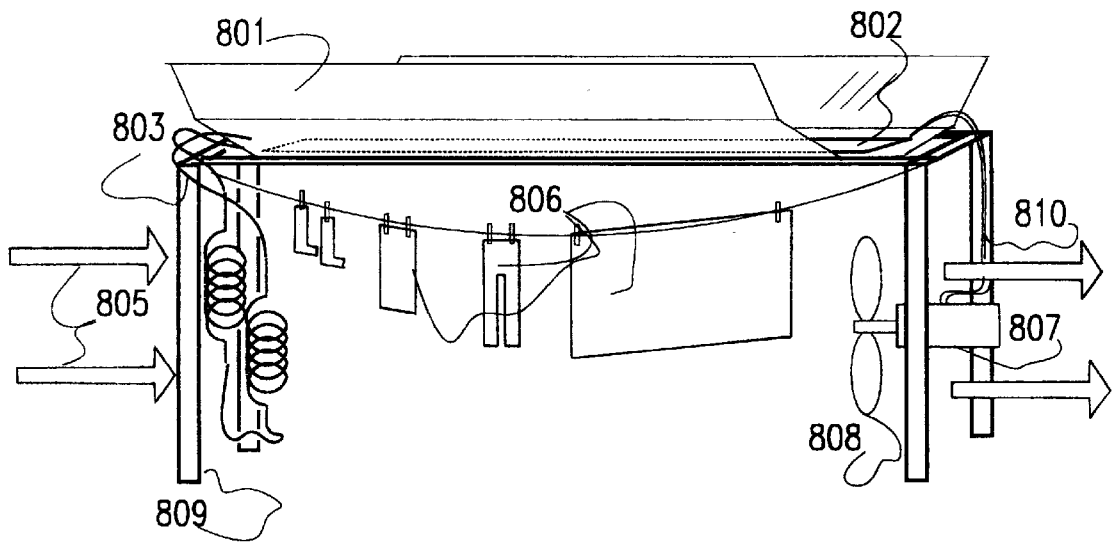

FIG. 8: illustrates a materials-drying environment according to the invention.

Figure 11:
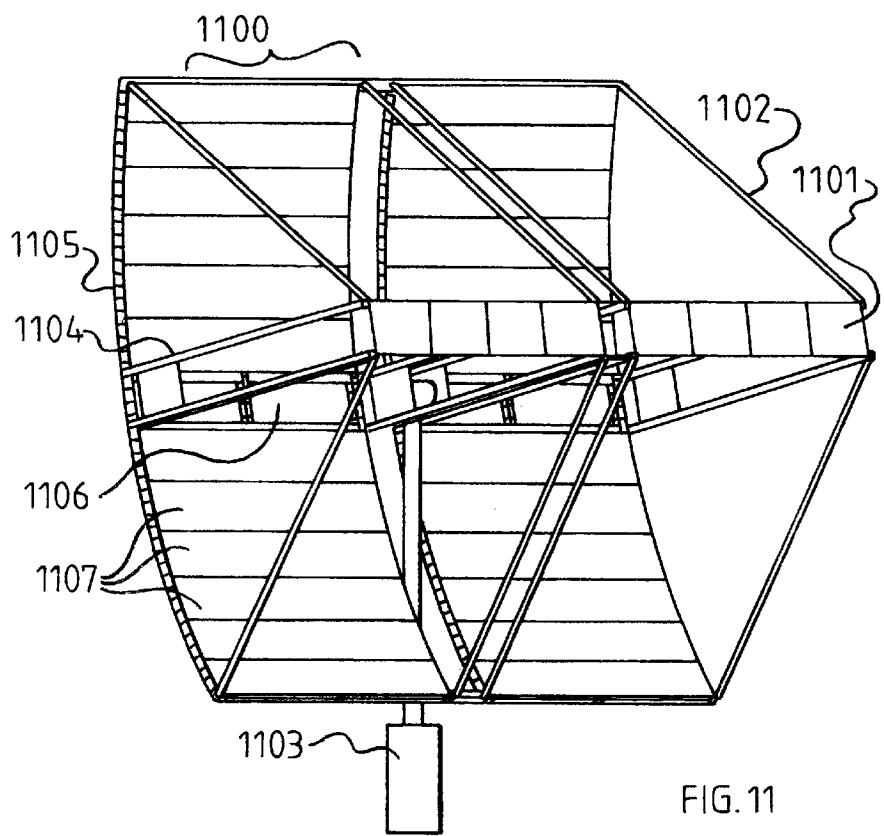
Figure 9:
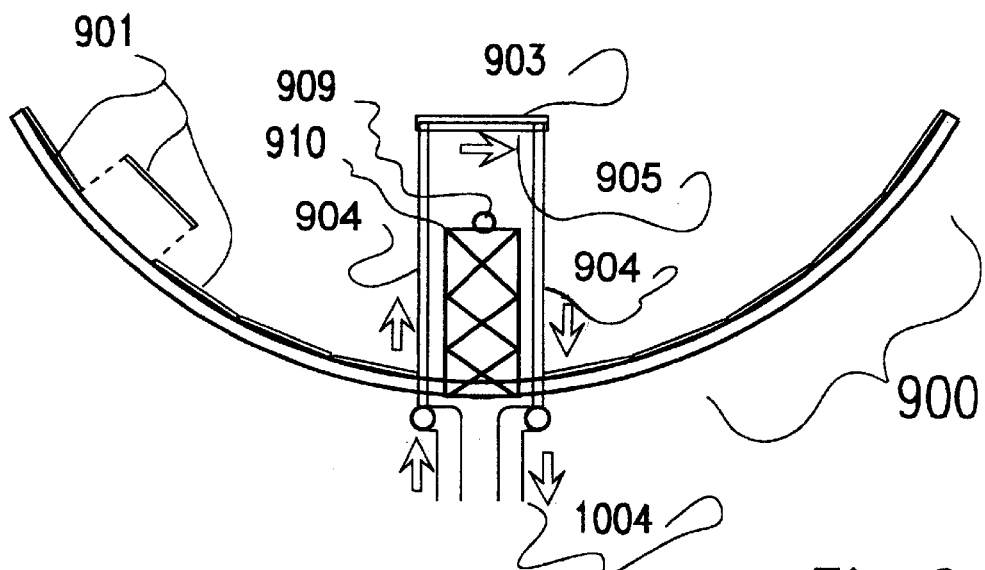

FIG. 9: is a diagrammatic section across the heliostat of FIG. 11.

Figure 10:
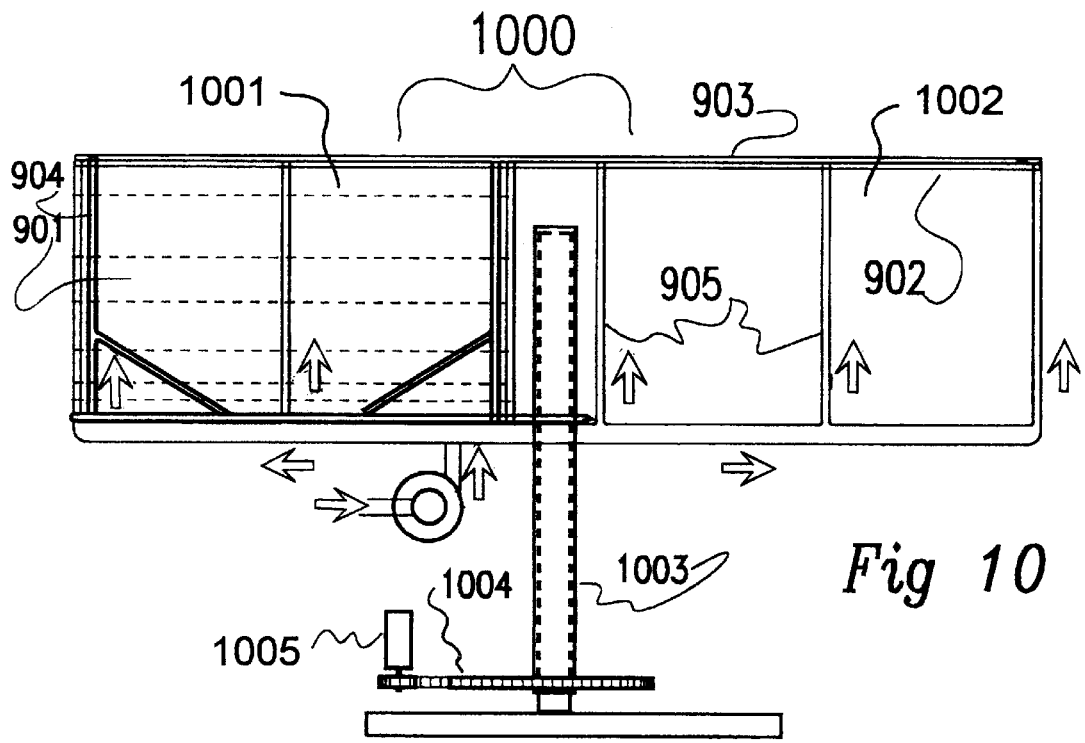

FIG. 10: is a diagrammatic section along the length of the heliostat of FIG. 11.

FIG. 11: is a perspective view of a directable heliostat/light concentrator according to the invention.

Figure 12:
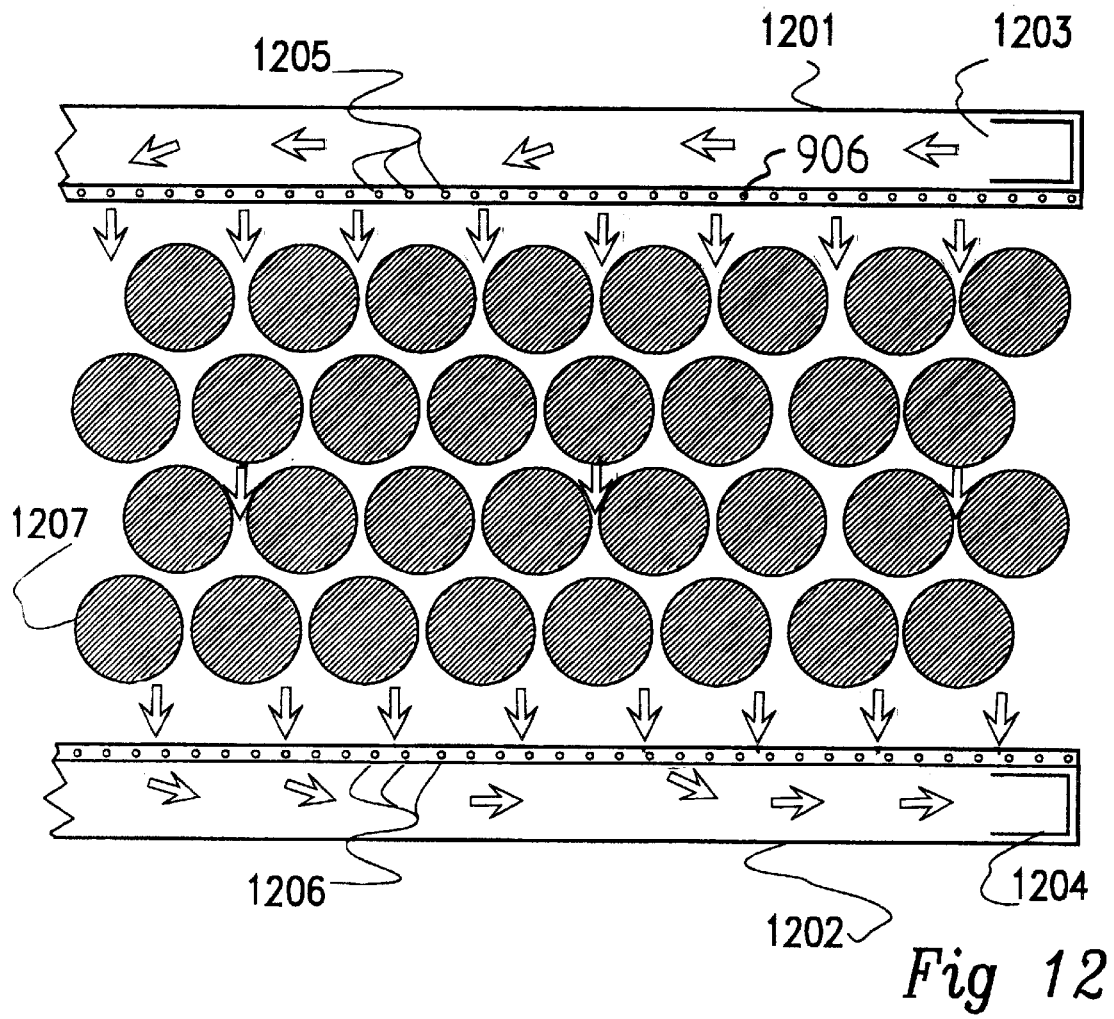

FIG. 12: illustrates the surface view of a fluid-cooled array of silicon photocells, according to the invention.

Figure 13:
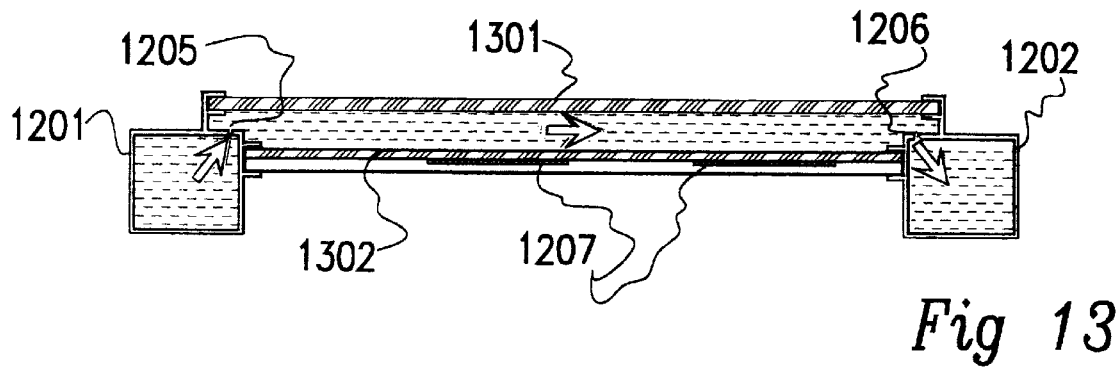

FIG. 13: illustrates a fluid-cooled array of silicon photocells, according to the invention, in section.

FIG. 14: illustrates several options for the radiation-absorbing surface, according to the invention.

Figure 15:
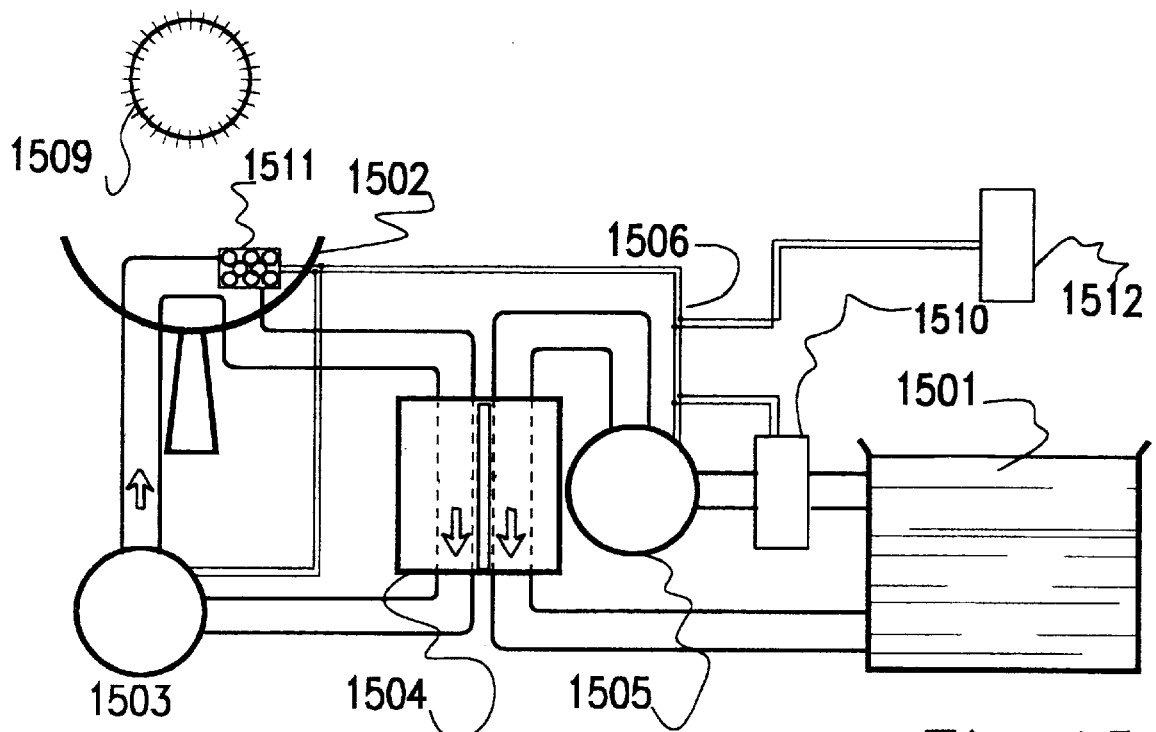

FIG. 15: illustrates a flow diagram of electricity, fluid, and water for warming a swimming pool, according to the invention.

Figure 16:
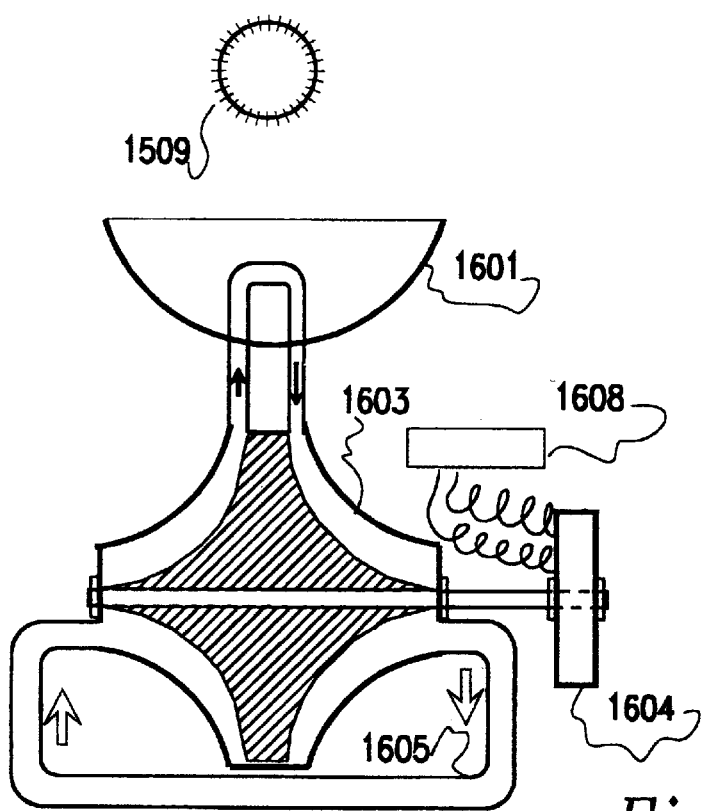

FIG. 16: illustrates a dynamo driven by a fluid-powered motor, according to the invention.

PREFERRED EMBODIMENT

Surprisingly, it has been found possible to improve the collection of energy from the sun without using esoteric types of solar cells. The invention is based on the realisation that:

1) only a part of the radiation from the sun reaching the surface of the earth is of wavelengths compatible with conversion into electricity by solar cells, 2) present-day solar cells are relatively inefficient and expensive, 3) much of the remainder of the radiation from the sun is or can become heat, 4) that heat, being a type of "low-grade" or relatively cool heat may be useable but if not removed from the solar cell will adversely affect conversion efficiency in the short term and affect the semiconductor structure in the long term.

A common thread running through various embodiments of the invention is the concentration of sunlight onto an absorbing surface including (but not necessarily totally comprised of) solar cells and the simultaneous removal of heat from the absorbing surface carried out with the aid of a moving fluid, which in most examples is transported using some of the electricity from the solar cells. This combination is surprisingly useful and provides for more economical use of solar energy. Various embodiments of the invention may be optimised further towards electricity production—having more solar cells providing an excess of electricity for export—or further towards heat production, then having a minimum number of solar cells sufficient to direct a concentrator array of mirrors and shift heat about for one purpose or another.

One example illustrates a swimming pool heater in which any excess electricity left over after water purification (filtration, chlorination, etc) may be stored or after conversion into AC returned into the mains power distribution network or the public utility network.

Another example illustrates a water heater in which electricity generation is only incidental and is mainly used to maximise the collection of heat (such as by directing the concentrator towards the sun). Intermediate examples are of course possible. Indeed, heat removal by means of a heat pipe may allow passive (un-pumped) removal of heat from the absorbing surface.

A further example is a hybrid and uses some electricity to "top up" the temperature of a container of hot water.

A yet further example uses a heat engine such as a turbine or a Stirling cycle engine to convert heat into kinetic energy and then into electric power or some other desired form of power.

Another example mainly produces warm or hot air for drying things; electricity is used to assist air movement. This may be applied within a greenhouse or glasshouse, where heat may be added to the building and electricity may be used for environmental conditioning and for lighting.

This summary will now be expanded with illustrative examples.

EXAMPLE 1

Swimming Pool Heater with Additional Electricity When Available

This embodiment provides one or more arrays of solar cells at the focus of a solar concentrator, each cell being in thermal contact with a water cooled surface that provides cooling means for the array so that during conversion of sunlight into electricity the array is kept cooler than it would be if no means for cooling existed. Its output is higher—the band gap of a silicon P-N junction rising as the temperature of the junction drops. We understand that for silicon, temperatures of over 65 deg C. result in a significant fall in output and hence if the invention is to be used for both heat and for electricity output then its temperature may be maintained somewhere between heat sink temperature and 65 degrees C. In any case, our example fluid circulation system is not built to withstand pressure and hence could not support coolant of over about 100 deg C. (if water-based). The actual temperature may be optimised for efficiency, depending on parameters that may be established at or after installation. The heat from the array is dumped into a heat sink—in this example a swimming pool. Water is a suitable coolant for sinking heat because it has a high specific heat, and other uses such as inputs to a domestic water heating installation or even an air heating device using the water as a store. Therefore, the low-grade heat taken from the array can be usefully used. Thus this invention is "symbiotic" as it provides two mutually beneficial functions; on the one hand electricity is generated more efficiently even if the "concentrator" function is not considered, and on the other hand water is heated within an installation that provides a useful by product—electricity.

Preferably the process of heat transfer includes (as shown in FIG. 15) a closed circuit for a primary coolant through a solar concentrator 1502, then through a heat exchanger 1504, and then through a pump 1503 and back to the heat exchanger, while the heat exchanger warms water from a swimming pool 1501, which water is circulated by a pump 1505 and may be "conditioned" (chlorinated etc) by a module 1510. The sun 1509 also illuminates a solar cell array 1511 which powers (via wires 1506) the pumps and conditioner, and surplus electricity may be converted by module 1512 into "domestically acceptable" electricity—such as 230 V, 50 Hz AC power.

The preferred primary coolant is preferably mostly water though using additives such as corrosion inhibitors, algal growth inhibitors, and antifreeze additives. Corrosion inhibitors are included because of the presence of aluminium conduits and aluminium welds in contact with water, algal growth may be a problem where the water flows over a well-lit absorbing surface, and freezing may occur during winter nights so apart from frost plugs it is desirable to lower the freezing point of the coolant to −10 deg C. or below. Motor vehicle antifreeze is suitable and has anti-corrosive properties. The use of nonaqueous primary coolants, such as light oils (which can be in direct contact with the solar cells), may require alternative additives.

As a development on the basic principles of the invention, the array may be made cooler than the ambient temperature ("ambient" referring to the temperature of the incoming water), and the mass of water may be forced to relatively high temperatures by using a heat pump instead of the heat exchanger 1504 to actively transfer heat from the array and its circulating fluid into the pool. This second option consumes more energy than that required to circulate cooling water, but as the scale of the installation expands it becomes more cost-effective.

Photovoltaic Array

The preferred photovoltaic array is preferably composed of a relatively efficient type of cell; because the extra costs in providing such a cell are compensated for by a higher output. Example preferred types available at this time provide 20–25% conversion efficiency and include several conversion layers; a blue-responsive layer outermost, then a green-red responsive layer, and then an infra-red layer. Other preferred types are made with gallium rather than silicon. Nevertheless it may be more economic to use a relatively inefficient (10–18%) cell in some optimisations. The semiconducting surface of a purpose-built cell is preferably provided with an adequate amount (in terms of cross-sectional area) of conductive metallic strips so that the generated current—which may be 10 times greater than that envisaged by its manufacturers—does not cause overheating of the semiconductor or even melting of metal conductors.

Alternatively, dedicated designs of solar cells may comprise an amorphous type comprising layered amorphous silicon constructed on a non-planar surface such as on the curved surfaces of FIGS. 1–7. Developments in the construction of these cells appears to allow cell material to be evaporated or sprayed onto any surface to form a conforming coating.

As is common in the art of power generation from photovoltaic cells, we provide a number of individual cells in series, and connect a number of such series in parallel, along with means to balance out loading if for example a part of the array is in a relatively poorly illuminated position. This provides an adequate current at a voltage sufficient to overcome voltage drops in solid-state switches, and power losses in transmission lines. A preferred operating voltage is at least 24 volts, more preferably 100 or more volts so that transmission losses and semiconductor losses are minimised particularly when the sunlight is weak and the actual voltage drops. Of course a step-up converter may be provided as is known in the art, to maintain a constant output voltage though at varying currents. If electricity is to be used solely for directing the concentrator, an output of 12 or 24 volts may be adequate.

Typically an array used in combination with this invention may produce upwards of 500 watts and more typically 3 or 4 Kilowatts or more of electricity as direct current. Applications for the electricity include local maintenance functions such as:

pumping cooling water to and from the pool, pumping refrigerant through a heat exchanger, running a heat pump, and directing a concentrator of solar flux. Surplus electricity may be used for other purposes which may include:

charging storage batteries for (for example) nocturnal pool illumination, running pool filter motors, electrolysing chloride ions added to the water as common salt, thereby providing pool chlorine for disinfectant purposes (see FIG. 15/1510), running a pool cleaning device, or heating household water (or even pool water).

After conversion (at 1512) to mains electricity in the correct phase and amplitude, such as with active switching devices controlled so as to produce a simulation of a true sine wave (or even a filtered square-wave type of converter), surplus electricity may be fed into the house mains and may even be exported (for payment) from the property into the power board's local distribution.

Non-directed Concentrators

The array of light-to-electricity conversion cells (photovoltaic cells) is preferably housed in a special construction. One approach (see later) is to use directors of light—such as lenses and/or mirrors to direct the sunlight from a larger incident area onto a smaller area comprising the array of cells. These are more useful in direct sunlight and most designs require active steering in order to aim the directors at the sun. Suitable designs of lenses and/or mirrors may use the Fresnel lens approach.

A simpler approach is to lay out an arrangement of pipes below cells as a planar array—although a ridged surface covered with a photovoltaic layer may be more effective in some cases. The planar array may have no light concentrating means or optionally with light concentrators as well, means such as at least mirrors or mirrors and lenses to the south for southern hemisphere installations, or be installed on a slope facing the sun (as FIG. 7).

Provision of a light-to-electricity transducer in the form of an amorphous silicon photovoltaic array sprayed onto a surface comprised of ridges—optionally a zigzag shape, hemicircular profiles or corrugations—has the advantages that:

(a) more silicon per unit area can be provided, pushing back the barrier of maximum conversion per lumen, (b) at least some of the silicon is normal to any incident light, so increasing the efficiency, (c) particularly if the silicon is deposited on fluid-carrying members having a circular tubular cross-section, flexure of the surface carrying the silicon as a result of pressure changes applied to the medium are minimised.

We anticipate having 50 to 60% more available electricity per unit area of collector as a result.

We propose to concentrate sunlight onto the array surface using mainly mirrors but optionally Fresnel lenses or the like as well. As mirrors we propose to use sectors of substantially flat acrylic or glass mirrors or the like (possibly polished stainless steel or other metals) wherein each sector is of dimensions such that substantially all the light incident on it (less reflection losses) arrives on the array. Curved mirrors are an option but there is little advantage in causing the light to reach a focal point (or line). We expect to use concentration ratios of from two or three times up to 18:1 over ordinary sunlight, subject to the ability of the cells to use the light. There is some indication that conversion from photons to current within silicon is unlikely to be the limiting factor in conversion at much greater intensities or concentrations of sunlight.

We propose a modular installation 100 in which we provide (a) end-pieces 101 and 103 in which water flow (in at 106, out at 105) is directed through a pattern of pipes with the aid of a pump 104, and (b) optional mid-pieces 102 in which water flow is in multiple straight paths. Watertight connectors are provided so that end-pieces and mid-pieces can be mated to each other (as at the junction 107) to build up an array of cells 108 over a desired area, and water inputs and outputs are provided, preferably on one (as 103) or both of the end pieces. All the pipes of an installation may be connected in series, or they may be connected in series/parallel, or all may be connected in parallel, depending on optimised operation for one purpose or another.

We provide an array of a given capacity and a given cost with an optimised environment for maximum power generation. The "usefulness" of a semiconductor junction as reflected in the band-gap voltage which sets the output voltage per cell and hence the power is greater at lower temperatures, and is a function of the Absolute Temperature. There is an advantage therefore in at least preventing the active surface of the array from being heated by otherwise useless long-wave infra-red radiation and preferably also cooling the surface to temperatures below the ambient temperature and possibly even to −20 deg C. or below, as this raises the power available from a given investment in photovoltaic cells.

Therefore we provide cooling means in good thermal contact with the array. One approach to this is to provide a thermally conductive metal backing to the array, a type which is constructed with heat transfer in mind. If an amorphous surface is applied to a specially designed shape, this shape can be for example made of cast aluminium or the like and provided with channels for coolant. Otherwise a flat plane of metal provided with coolant channels may be used as a heat sink, and preferably a thermally conductive paste is also used to assist in making a good thermal contact.

Preferred coolant may be: (a) a refrigerant in a closed cycle passing through a heat pump that extracts heat from the refrigerant into a body of water, (b) a refrigerant which is cooled by thermal contact in a heat exchanger with a body of water, or (c) the body of water, pumped through the channels.

Figure 3:
Figure 4:
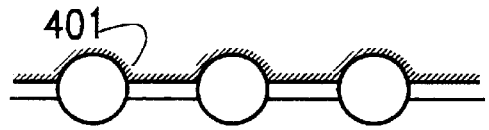
Figure 5:
Figure 6:
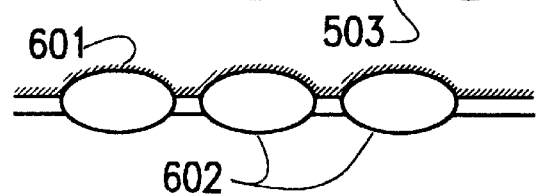

Tubes carrying water may be round (as in the section A—A at FIG. 4), part-round (FIGS. 2 and 3), or oval (FIGS. 5 or 6) or may be created by laying down a bent strip within a cavity (not shown). The advantage of the section of FIG. 2 is that it can be used with flat solar cell wafers. The section of FIG. 3 maximises the surface area available, and the amount of cooling contact. FIG. 3, or a circular-piped variant of it, is probably the best variation. Use of circular profile pipes minimises any distortion of the pipe walls as the pressure of the internal coolant changes. Distortion can cause stress fractures in fragile silicon.

In these figures the solar cell layer is indicated by hatching, as 201, 301, 401, 501, and 601. Fluid-carrying tubes are as 602, and areas such as 503 are intermediate sections. It is possible to have the tubes touching each other with no intermediate sections as in FIG. 3. FIG. 7 shows an array 702 inside a glass-windowed (701) surround where the use of a glass window retains heat so that more heat passes to the coolant, while the array functions in the usual way to collect electricity. This array may be orientated to lie facing the sun, using a strut to set its attitude.

The shapes shown in FIGS. 1 to 7 may conveniently be cast or injection-moulded from a plastics material or pressed from a metal, or even cast from aluminium—the extra rigidity of which should minimise stress fractures of the cells.

In order to improve heat trapping the modules 702 of the installation may be run under a glass window (701 of FIG. 7) and preferably in an evacuated housing 703 or one containing a sparse matrix of fine fibres such as glass wool to inhibit the air movement of convection.

The heat emerging from the dome containing the solar array is preferably passed into a swimming pool, although other heat sinks such as a domestic water heater, or a pre-heater for a two-stage system or even a heat storage device used for nocturnal house warming may be used as alternatives. Water is an effective heat sink as it has a high thermal capacity of 1 calorie per ml. Alternatives include low-melting-point waxes; however as one of the main purposes of this invention is to provide a warmed swimming pool we prefer to dump the heat to the pool.

While dimensions are not finally determined we hope to obtain an electrical output of nominally 3 kW from each mid-piece unit 102 having an area of 4×4 meters. More than one mid-piece unit 102 may be used. The end units 101 and 103 may also have solar cells applied.

Directed Concentrator or Heliostat

This has become a preferred device. A relatively cheap steerable heliostat 1100 (comprising two concentrator units each having an area of about 1650×3400 mm across (5.6 m$^2$ each) (as shown in FIG. 11) concentrates light onto a relatively small absorbing surface 1101, 300 mm wide, which includes some solar cells. The surface may not be totally covered by solar cells, and the parts not covered may be (a) simply blackened aluminium or the like, (b) provided with a separate circulation that allows a higher temperature to be reached, and/or (c) placed more exactly at a focus of the heliostat. For example a surface like this might be curved to receive more radiation at normal incidence thereby reducing reflective losses. (FIG. 14 shows examples of various options of absorbing surface, as seen from the mirror side.). The strut 1102 helps support the panel at the focus of the heliostat, and conduits 1104 carry heat-removing fluids to and from the array 1101. The heliostat can turn on pillar 1103. (We have not illustrated the linear actuator for the tilt axis; the actuator extends between the pillar and a side arm of the heliostat). There is an empty space 1106 which is obscured by the absorbing surface. Mirror panels 1107 are preferably of graded width diminishing towards the outer edges; for example 297, 290, 278, 264, 249, and 232 mm wide. 1105 is a part-circular frame having a radius of 4.194 meters. The width of the heliostat is 3.444 meters and the combined length is 4 meters. The weight of the structure is about 130 Kg; the mirrors are about 70 Kg and the structure is substantially balanced about the tilt pivot 909.

The uppermost includes three solar cell panels (1401, 1402, 1403) and is provided with an inlet pipe 1404 and an outlet pipe 1405 for a cooling/heat removal fluid. The valve 1413 is for air admission/ejection during an overnight shutdown procedure. The second option has one solar panel 1406, and a blackened surface (preferably highly absorbtive in relation to infra red light as well) 1407, which is provided with a separate system for heat transfer media, because a higher temperature may be tolerated here. (It may be in series with the solar cell media; the solar cell media flow providing initial heating). The third option is a higher temperature option than the second; having a greater ratio of concentration of light for purposes such as running a fluid-powered motor (see FIG. 16). Here it is more likely that the solar array will be cooled with water and the fluid used in the hotter part 1410 may be a gas. Finally, the option at 1411 is simply a heat-absorbing body; a solar array 1412 is mounted separately and quite possibly is not exposed to the concentrated light at all. The option 1411 (or the second option 1406/1407) may be best suited to a hot water generation configuration, wherein the primary purpose of the heliostat is to make hot water (60–95 deg C.) and electricity is likely to be used only for powering the steering and control mechanism of the heliostat (see below) and for pumping the heat removal fluid.

Again, the array of cells is preferably housed in a special construction, in this instance the cells, and possibly a passive absorbing surface as well, is mounted at the focus of a light concentrator such as a trough-shaped set of mirrors forming a concave surface. The mirrors direct the sunlight from a larger incident area onto a smaller area comprising the array of cells, typically concentrating by 10 times or more, in direct sunlight. Active steering is provided in order to aim the concentrator at the sun, or away from it if a fault develops or wind loading occurs. Our preferred mount is an altazimuth mount, fitted with actuators driven from a controller equipped to sense sun direction as well as monitor operating conditions.

FIG. 9 illustrates the concentrator in cross section 900 and FIG. 10 illustrates a side view of it 1000, including coolant circulation. This example has two separate heliostat units 1001, 1002 on each side of a central supporting pillar 1003, which is rotatable by means of a drive chain 1004 and a motor 1005. The concentrator may be tilted by a linear actuator 908. This example includes solar panels 903 over the entire absorbing surface 902 because its application requires surplus electricity beyond that required to maintain the operation of the concentrator itself. The cross section shows a number of mirrors 901 (lifted off for clarity) mounted on a frame 904 bent into an arc. Each mirror is aligned so that light reflected from all of them passes through a focal plane, when the heliostat is directed at the sun. While a parabolic profile might be theoretically perfect, we have found that a section of a circle is an adequate profile. The mirrors 901 are made of back-silvered float glass so that they can be wiped clean from time to time without destroying the reflective surface. A gold reflective coating is preferable because gold is known to reflect more infra-red light, though we have yet to determine whether the passage of the incoming light through the glass twice would counteract that improvement. Preferably, a front-coated gold surface with an overlay of a hard material such as silicon monoxide or the like would be used.

The support members 904 for the absorbing cells are tubular. One set carries primary coolant within them up to the absorbing surface, where the coolant, still contained, passes over the lit surface 905 of the solar cells and is taken back down the other set of supports to means to dispose of heat. The coolant emerges through a set of small holes 906 so that flow over the entire absorbing surface is relatively consistent. It returns through another set of small holes, provided partly in case flow is to be reversed. Extrusions used to frame the cells have been designed to provide a window frame structure about the absorbing surface. Pipes 1004 carry the coolant to and from the support members. Framework 910 supports the heliostat about an altitude pivot 909.

FIGS. 12 and 13 show details of the preferred solar cell mounting and cooling means. FIG. 13 is a cross section of the area labelled 903 in FIG. 9. Here, 1301 is a toughened glass window through which the concentrated light enters the absorbing surface. Light passes through the fluid and through a second layer of glass 1302 which comprises part of a commercially produced array module. The actual silicon cells 1207 are glued to the second layer of glass which comprises a partial but insubstantial barrier to heat flow. Some infra-red light is absorbed by the glass or the fluid (mainly water). The fluid arrives from a conduit 1203 along a duct 1201, preferably made of an aluminium extrusion, and passes into the space above the cells 1207 through an array of holes 1205. It passes across the array and enters a removal duct 1202 and then a removal conduit 1204 through a further array of holes 1206. Because it is useful to retain the heat removed from the absorbtive surface, any conduits used to carry fluid are preferably thermally insulated. Preferably the space filled with fluid is sealed to be waterproof.

(A variation of a circulating coolant is to use heat pipes, which are closed elongated devices containing a fluid which is caused to evaporate at a first, heat-absorbing end, whereupon the fluid flows as a gas to and condenses at a second, heat-radiating end. The liquid fluid travels by capillary action back to the evaporative end. These devices are primarily used to cool electronic modules by carrying heat to a heat-dissipating space.)

(In a preliminary trial on 10 September at 4 PM with a clear sky at latitude 36 S, 266 W was collected from 8×10 W arrays (expected 80 W if used in stand-alone basis in full sunlight) and the arrays reached 56 deg C. within 2–3 minutes. These conditions are estimated to be ⅓ or less of full sunlight).

The preferred steering means is a two-axis solar tracker and conveniently there is provided a microprocessor to control the tracking process and various regulatory processes as well. Included in the control algorithm are:

1. Sun tracking means—based on a feedback loop. Alternatively the device may be installed with a clock/calendar and a table of solar positions so that when correctly informed as to local time and date and latitude it points to the expected position of the sun so that it is ready to collect radiation.

2. Wind monitoring means—as sensed by an anemometer or by stress sensing devices within or upon the frame of the concentrator. If high winds or stresses are detected the device shuts down and goes into a "safe" attitude typically facing vertically.

3. Flow monitoring means to ensure that the heat removal process is functioning normally.

4. Solar cell surface temperature monitor to act as a primary control of flow rate, and as an ultimate arbiter of faulty conditions which require that the tracker be deflected away from the sun so that the cells are protected from overheating. A demand monitor provides a more indirect indication. The device may be in a situation where little power is being drawn, whereupon it may be steered so as to partially move away from the sun.

5. Overnight shutdown processing; while the use of antifreeze in the fluid medium may be sufficient to prevent freezing it is likely that draining the conduits and solar cell area is better so that fluid does not freeze overnight within conduits and block fluid flow on subsequent startup. One preferred shutdown procedure is to: Aim the array vertically, though with a tilt so that an air admission valve close to the solar array is uppermost, then open the valve and allow the fluid to drain from the heliostat into a holding tank. Then a preferred restart procedure is to pump fluid back into the heliostat until fluid reaches the air admission valve, and close the valve. Then the heliostat is tilted towards the rising sun.

6. Actuator motor current, in order to determine when mechanical movements of the concentrator/heliostat have reached a limit or a blockage of some type.

The preferred control device is a microprocessor or the like, equipped with a number of suitable input and output interfaces. It may also perform other specific duties such as supervising the disposal of surplus electricity. This may be diverted into charging of storage batteries for (for example) nocturnal pool illumination or maintaining the concentrator's power over periods without sunlight, or converted into mains-type (230 V, 50 Hz AC or 117 V, 60 Hz AC) electric power for use in an associated building or for return to the utility grid. After conversion to mains electricity in the correct phase and amplitude, such as with active switching devices controlled so as to produce a simulation of a true sine wave (or even a filtered square-wave type of converter), surplus electricity may be fed into the house mains and may even be exported (for payment) from the property into the power board's local distribution.

Running a pool cleaning device, or heating household water (or even pool water), are other options for using up surplus electricity.

In the case of a swimming pool, the controller can also be used to supervise and control pool filter motors by testing for opacity then filtering as required, testing for chlorine content and electrolysing chloride ions added to the water as common salt, thereby providing pool chlorine for disinfectant purposes, or other functions.

Reverting to directing the concentrator or heliostat; other mounting options include an equatorial mount with manual adjustment perhaps on a weekly basis to adapt to sun height. This version saves perhaps $500 manufacturing costs by deletion of one actuator (the altitude one) but is not able to park itself in a vertical position if the wind is too strong. If efficiency is not a prime concern a fixed concentrator aligned with the mean solar path may be adequate.

Heat Engine Version

Here, a concentrator or heliostat as described previously is used to collect heat from solar radiation and the heat, even though it is low-grade according to conventional standards, is used to drive a fluid-powered motor such as a positive-displacement motor or a turbine, or a heat engine such as a Stirling cycle engine. This version is relevant where kinetic energy is desired rather than heat itself.

Several modes of operation exist.

1. Most of the concentrated light collected by the heliostat is focused on non-electrical absorbtive surfaces. (See FIG. 14; all options but the uppermost). A small proportion of the surface, which may be less concentrated, comprises solar cells or the like to provide energy for internal functions such as directing the heliostat, running the controller, or pumping fluids about. The focused light causes a heat transfer fluid to be heated. In a preferred embodiment the fluid is caused to boil at the absorbtive surface (the conduits being capable of holding the resultant pressure). The vapour drives a turbine coupled to a dynamo and a pump and the vapour is then condensed in a heat exchanger. The dynamo produces electricity for export. The pump forces fluid under pressure into the conduit to the absorbtive surface. With reference to FIG. 16, showing a dynamo system diagrammatically, the fluid leaving the heliostat 1601 is passed through a turbine 1603 where the fluid expands, loses heat, and drives the rotor as it does so. The exiting fluid is carried by the pipe 1605 to a compressor which returns the fluid to the solar concentrator. A dynamo 1604 also coupled to the shaft of the turbine supplies electricity to a conversion and control device 1608, which can export surplus electricity. In one version the dynamo may be an induction motor, connected to the AC mains, or in other versions it may be a DC or AC generator the output of which is rectified and possibly even stored within 1608 before being made available for use. It is estimated that a heliostat coupled to a dynamo in this manner could produce about 5 kW for export during peak daylight hours and the capital cost of the installation (per kilowatt) is less than that of a thermal power plant, and less than the use of semiconductor electricity generation as with solar cells. This device if widely used can substantially support conventional generation in hydroelectric generating plants, thermal generating plants, and/or nuclear power plants.

2. In a variation of the above, a Stirling cycle engine or the like is used to convert heat into kinetic energy, with or without a vaporisation stage, and heat removal again occurs in a heat exchanger.

3. In a further variation, a heat pipe is used to carry heat from the absorbtive surface to a Stirling cycle engine.

EXAMPLE 2

Heated Volumes of Air, for Drying, for Example

In this alternative, we provide the invention in a form in which air is heated, and usually moved, in an energy-efficient manner. One embodiment is as a portable hot-air drier or "kiln" for drying timber, grain, or other agricultural produce.

The drier (see FIG. 8) includes supports 809 holding up a roof structure 801 which is adapted to collect light and heat. Some of the light is converted to electricity. The heat collection means may for example comprise a system of channels carrying piped heat-carrying fluid which percolates beneath a substrate supporting solar cells (or just a black layer if sufficient electricity is available from a portion of the available area) and carries heat arriving from incident radiation away to a heat exchanger through which ambient air is drawn before passage past the material to be dried. Means are provided to remove the heat from the roof and inject it into moving air, so that warmed moving air, having therefore a lower relative humidity, is made available. FIG. 8 shows an array of mirrors 801 concentrating sunlight onto a collector 802 which at least in part comprises a photovoltaic array for providing electric power. In FIG. 8 power passes along a cable 810 to drive an extractor fan motor 807 with a fan 808, though in other variants it might drive a heat pump. (For some applications, "thermal amplification" may be justified. It is provided by a heat pump drawing heat from the environment then dissipating it in a heat exchanger as described above, thereby raising the amount of heat in the drying current of air beyond that otherwise available).

The extractor fan of FIG. 8 draws air 805 past material to be dried (here shown as laundry 806 on a clothes line, but more industrially relevant applications include stacked, cut timber, wet sheep being prepared for shearing, and crops such as hay or the like. The air is first sucked past heat-dissipating means such as coiled pipes or finned heat exchangers connected to the heat extraction device 801 by pipes 803, and preferably the drier is provided with side walls so that the majority of the air passing through it has been warmed. Generally the material to be dried would be held in a room, functionally resembling a duct or tunnel through which the warmed air is drawn on its way to an exhaust fan. Both the fan and a pump to move the heat transfer fluid may be driven by electricity derived from the solar cells. If the side walls are removable the drier can be loaded by for example a fork-lift truck.

As a variation, the heat transfer medium may be the warmed air itself which is drawn past the substrate supporting the cells by a fan; optional radiating fins may be used to increase the transfer of heat from the substrate to the adjacent air.

EXAMPLE 3
Providing Cooled Air

Some produce, or other items, may be better if kept in a cooled air space and in this situation a heat pump in reverse, powered by photovoltaic cells as before, (or one driven by a heat engine) may remove heat from air within a space.

EXAMPLE 4
Providing Electricity but Dumping Heat

In this variation a cooling chimney or condenser is provided to dissipate heat into the atmosphere. A preferred chimney comprises a substantially vertical open tube or cylinder carrying within it, and more preferably near its base, a surface where heat is passed to the air which then rises up the chimney, as a result of its lower density, and draws unheated air in at the base. Preferably the chimney remains substantially upright despite redirection of the concentrator. One form of chimney comprises finned pipes about the base of the chimney. Another form comprises pipes soldered or otherwise in good thermal contact with the wall of the chimney (preferably of copper or aluminium) so that the wall itself passes heat to the air. Optionally a spray of water further cools the heat transfer medium in the tubes so that the solar cells are operated at a temperature below the ambient air temperature. Heat pipes may be useful in this version.

Alternatives

Options include variations on concentrators. FIG. 8 uses a fixed concentrator which does not track the sun so cannot be called a heliostat. The concept of a symbiotic combination of a solar cell and a heat producer can be applied to other solar energy devices, even roof-top tiles or the like.

Other options include putting the surplus heat out in air rather than in water—for heating a greenhouse or a home, for example.

If the array is enclosed in a suitable envelope it can be surrounded by a fluid coolant and here the action of water in filtering out certain long-wave infra-red radiation may be used to advantage so that this range of radiation does not reach the array. Thus the light impinging on the array is filtered by passage through an adequate thickness of water, for instance a 50 mm layer. Furthermore, if the array itself is electrically insulated by a conforming coating such as a varnish, the coolant may be in good thermal contact with the active front surface of the array. This is more effective than contact through a window. Preferably this water is not actual swimming-pool water but a purified water containing only protective compositions such as algal growth suppressants and corrosion inhibitors.

A more preferred option is to use a light mineral oil in contact with the array. Then the varnish over the semiconductors is not required, as the oil does not conduct. (Water would permit some current flow through inevitable pinholes, leading to rapid corrosion). A thin transparent window or membrane separates the oil from a filtering layer of water which is circulated through a heat exchanger or a heat pump, dumping excess heat into the swimming pool. The light mineral oil may have a viscosity approaching that of water.

It is known that some arrays at least lose their efficiency over time, so that in a year their output has dropped significantly below the original level. Some arrays can be reconstituted by baking at a moderately elevated temperature such as 300 deg C. for a period. Accordingly we propose to provide a "maintenance mode" in which the actions of the refrigerating system are reversed for a suitable interval from time to time in order to maintain a reasonably high conversion efficiency.

Finally, it will be appreciated that various alterations and modifications may be made to the foregoing without departing from the scope of this invention as set forth.

What is claimed is:

1. A solar concentrator for generating electricity and heat and having at least one concentrator unit, said at least one concentrator unit having:

an absorbing surface for converting incident solar radiation into energy having a long axis and a short axis;

concentration means including a plurality of planar reflective surfaces having a long axis and a short axis, and support means for supporting said absorbing surface and said planar reflective surfaces with their long axes aligned in a horizontal direction, and mounting means allowing the absorbing means and planar reflective surfaces to move in unison;

said support means supporting said planar reflective surfaces so that they approximate a curved surface;

wherein said absorbing surface is supported at or near a focus of said curved surface whereby said plurality of reflective surfaces reflect solar radiation towards said absorbing surface, said plurality of reflective surfaces being so dimensioned and supported on said support means that solar radiation reflected thereby is reflected towards the whole absorbing surface.

2. A solar concentrator as claimed in claim 1, wherein said absorbing surface has at least one passageway for the passage therethrough of a coolant.

3. A solar concentrator as claimed in claim 1, wherein the curved surface is a parabolic curve or a circular section.

4. A solar concentrator as claimed in claim 3, wherein the absorbing surface includes means capable of converting at least some of the incident radiation into a flow of electricity by means of a photovoltaic process.

5. A solar concentrator as claimed in claim 4, wherein the energy conversion means included in the absorbing surface includes a layer of solar cells covered by a one or more transparent or translucent passages, each passage being in effective thermal contact with the layer of solar cells and each passage being capable of carrying said fluid; so that heat may be removed from the absorbing surface.

6. A solar concentrator as claimed in claim 5, having at least one trough concentrator unit is capable of tracking the motion of the sun, so that an optimum concentration of radiation is reflected on to the absorbing surface.

7. A solar concentrator as claimed in claim 6, wherein power for use in causing the solar concentrator to track the sun and for transporting the cooling fluid is derived from the absorbing surface.

8. A solar concentrator as claimed in claim 7, further comprising a heated swimming pool, wherein the heat removed from the absorbing surface is transferred to said heated swimming pool.

9. A solar concentrator as claimed in claim 7, further comprising a reservoir of hot water, wherein the heat removed from the absorbing surface is transferred to said reservoir of hot water.

10. A solar concentrator as claimed in claim 9, wherein electrical heating means is provided within the reservoir of hot water, capable of further heating the reservoir of hot water by means of electricity including the electricity produced within the solar concentrator.

11. A solar concentrator as claimed in claim 5, further comprising a reservoir capable of holding a heated substance, wherein the heat removed from the absorbing surface is transferred to said reservoir.

12. A solar concentrator as claimed in claim 5, further comprising a drying chamber, wherein the heat removed from the absorbing surface is transferred to said drying chamber.

13. A solar concentrator as claimed in claim 5, further comprising a heat engine capable of converting heat energy into kinetic energy, wherein the heat removed from the absorbing surface is transferred to said heat engine.

14. A solar concentrator as claimed in claim 13, wherein the heat engine is mechanically coupled to a dynamoelectric machine capable of generating an electric current.

15. A solar concentrator as claimed in claim 13, further comprising a second heat engine operated in reverse in order to remove the heat from air within a space.

16. A solar concentrator as claimed in claim 3, wherein the energy conversion means included in the absorbing surface includes a layer of solar cells, and in which the electrical output of the layer of solar cells is increased over that to be expected from said solar cells in direct exposure to incident solar radiation, in proportion to the number of planar reflecting surfaces in use.

17. A solar concentrator as claimed in claim 16, having at least one chamber is connected to fluid transfer means capable of causing effective circulation of a cooling fluid along one or more passages to a heat utilisation means and back again, so that during use the cooling fluid is capable of transporting heat from the absorbing surface to the heat utilisation means thereby providing a useful energy output in addition to the electricity obtained by the photovoltaic process.

* * * * *